United States Patent
Shih

(10) Patent No.: US 7,869,222 B2
(45) Date of Patent: Jan. 11, 2011

(54) EMBEDDED ELECTRONIC COMPONENT STRUCTURE AND FABRICATION METHOD THEREOF

(75) Inventor: Che-Kun Shih, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 611 days.

(21) Appl. No.: 11/954,702

(22) Filed: Dec. 12, 2007

(65) Prior Publication Data

US 2008/0180930 A1    Jul. 31, 2008

(30) Foreign Application Priority Data

Jan. 31, 2007    (TW) .............................. 96103597 A

(51) Int. Cl.
*H05K 1/18* (2006.01)
(52) U.S. Cl. .................. 361/761; 361/763; 361/766; 361/795
(58) Field of Classification Search ......... 361/763–766, 361/784, 792–795; 174/262–266
See application file for complete search history.

(56) References Cited

U.S. PATENT DOCUMENTS 7,639,473 B2 * 12/2009 Hsu et al. .................... 361/260
7,742,314 B2 *  6/2010 Urashima et al. ........... 361/793

* cited by examiner

*Primary Examiner*—Tuan T Dinh
(74) *Attorney, Agent, or Firm*—J.C. Patents

(57) ABSTRACT

An embedded electronic component structure and a method for forming the same are provided, wherein the embedded electronic component structure comprises a lower laminating layer, a first clamping layer, a dielectric layer, a second clamping layer, an electronic component, an upper laminating later and a via interconnection. The first clamping layer is disposed on the lower laminating layer. The dielectric layer is disposed on the first clamping layer. The second clamping layer is located on the dielectric layer. The electronic component is embedded in the dielectric layer, wherein the lower surface of the electronic component contacts the first clamping layer and the upper surface thereof contacts the second clamping layer. The upper laminating layer covers the second clamping layer. The via interconnection is adjacent to the electronic component and penetrate the dielectric layer to respectively connect the first clamping layer and the second clamping layer.

20 Claims, 5 Drawing Sheets

EMBEDDED ELECTRONIC COMPONENT STRUCTURE AND FABRICATION METHOD THEREOF

CROSS-REFERENCE TO RELATED APPLICATION

This application claims the priority benefit of Taiwan application serial no. 96103597, filed on Jan. 31, 2007. The entirety of the above-mentioned patent application is hereby incorporated by reference herein and made a part of this specification.

BACKGROUND OF THE INVENTION

1. Field of the Invention

The present invention generally relates to a package structure and the fabrication method thereof, and more particularly, to an embedded electronic component structure and fabrication method thereof.

2. Description of Related Art

An embedded electronic component structure is a multiple stacked package (MSP), wherein an electronic component is embedded in the substrate thereof made of specific dielectric and resistance material or an organic glass fabric.

In order to provide a larger space within a limited substrate area for enhancing the integral electronic component function, depending on a practical application and the circuit characteristic and the demand of the module, one of substrate materials with different dielectric coefficients and different resistances is chosen and active/passive electronic components, such as capacitor, resistor or high-frequency transmission wire, are embedded in the substrate, so that the integral performance of the component can be advanced by means of shortening the circuit layout, lowering the quantity of the employed electronic components in surface mount mode and decreasing the signal transmission distance. The above-mentioned package structure is advantageous in reducing process and testing cost of the product using the package structure, lowering the number of solder contacts, increasing the integral electrical high-frequency respond of the electronic component and advancing the precision and reliability of product packaging.

However, the combining strength between the electronic components embedded in the substrate and the package structure is likely insufficient in the prior art, which often causes a delaminate or fracture problem, and the production yield is accordingly reduced along with an increasing manufacturing cost.

SUMMARY OF THE INVENTION

Accordingly, it is badly needed to provide an improved embedded electronic component structure and the fabrication method thereof for solving the delaminate or fracture problem caused by insufficient combining strength between the electronic component and the package structure in a conventional embedded electronic component, and further advancing the production yield and decreasing the manufacturing cost.

An embodiment of the present invention is directed to an embedded electronic component structure, which includes a lower laminating layer, first clamping layer, a dielectric layer, a second clamping layer, an electronic component, an upper laminating layer and a via interconnection, wherein the first clamping layer is disposed on the lower laminating layer, the dielectric layer is disposed over the first clamping layer, the second clamping layer is located over the dielectric layer, the electronic component is embedded in the dielectric layer, the lower surface of the electronic component contacts the first clamping layer, the upper surface of the electronic component contacts the second clamping layer, the upper laminating layer covers the second clamping layer, and the via interconnection is adjacent to the electronic component, penetrate the dielectric layer and respectively connect the first clamping layer and the second clamping layer.

Another embodiment of the present invention is directed to a fabrication method of an embedded electronic component structure. First, a lower laminating layer is provided, following by forming a first clamping layer on the lower laminating layer and then forming a dielectric layer over the first clamping layer. Next, an electronic component is embedded into the dielectric layer so as to make the lower surface of the electronic component contact the first clamping layer. After that, a second clamping layer is formed over the dielectric layer so as to make the second clamping layer contact the upper surface of the electronic component. Further, a blind hole penetrating the dielectric layer is formed to reach both the first clamping layer and the second clamping layer. Furthermore, the blind hole is filled to form a via interconnection to respectively connect the first clamping layer and the second clamping layer.

According to the embodiment of the present invention, a first clamping layer and a second clamping layer are adopted to respectively contact the upper surface and the lower surface of the electronic component embedded in the dielectric layer, following by filling the blind hole adjacent to the electronic component and penetrating the dielectric layer to form a via interconnection for connecting the first clamping layer and the second clamping layer. In the present invention, the combining strength between the electronic component and the package structure is enhanced by means of a clamping structure formed by the via interconnection, the first clamping layer and the second clamping layer. In this way, the problems of a conventional embedded electronic component that insufficient combining strength between the electronic component and the package structure and the delaminate or fracture caused by the insufficient combining strength can be solved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
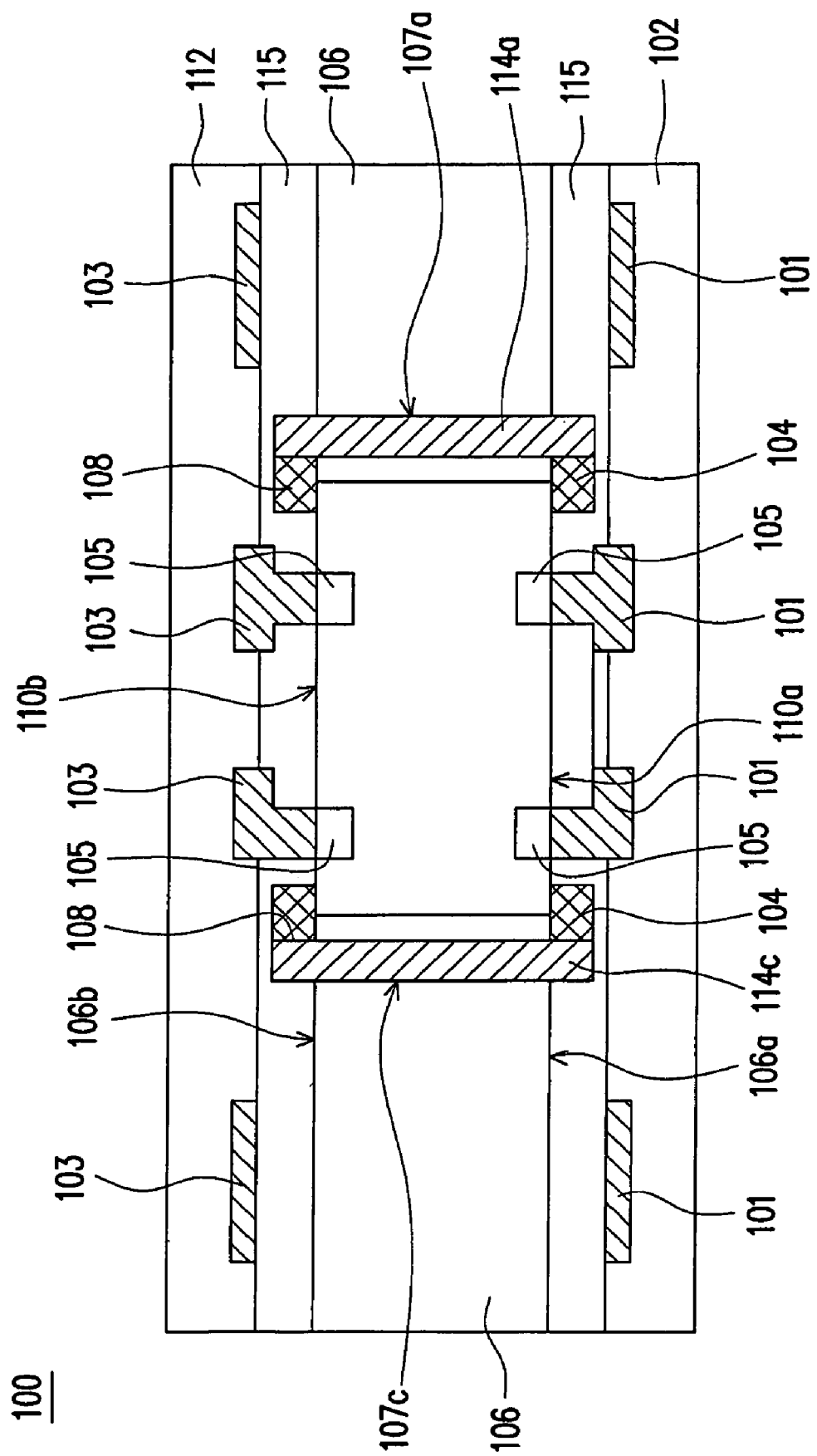
FIG. 1A is a sectional diagram of the first embedded electronic component structure 100 according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

An embodiment of the present invention provides an embedded electronic component structure and the fabrication method thereof to advance the production yield and lower the manufacturing cost by enhancing the combining strength between the embedded electronic component and the package structure.

FIG. 1A is a sectional diagram of an embedded electronic component structure 100 according to the first embodiment of the present invention. Referring to FIG. 1A, in an embodiment, an embedded electronic component structure 100 includes a lower laminating layer 102, a first clamping layer 104, a dielectric layer 106, a second clamping layer 108, an electronic component 110, an upper laminating layer 112 and at least a via interconnection, for example, via interconnections 114a, 114b, 114c and 114d.

The lower laminating layer 102 is an insulation layer made of a dielectric material for protecting the embedded electronic component structure 100. The dielectric layer 106 is disposed on the first clamping layer 104, wherein the dielectric layer 106 has a thickness sufficient for the electronic component 110, for example, a passive component or an active component to be embedded therein and to make the lower surface 110a of the electronic component 110 contact the first clamping layer 104.

In the embodiment, the first clamping layer 104 is a metallic layer solely formed on the lower laminating layer 102 by plating process, spin-coating process or imprinting process, wherein the first clamping layer 104 is a metallic layer, for example, cupper. The embedded electronic component structure 100 further includes a first conductive trace layer 101 formed between the dielectric layer 106 and the lower laminating layer 102. The first conductive trace layer 101 may be located between the first clamping layer 104 and the lower laminating layer 102. In other embodiments, the first conductive trace layer 101 may also be located between the first clamping layer 104 and the dielectric layer 106.

In other embodiments of the present invention however (for example, that shown by FIG. 2), both the first clamping layer 204 and the first conductive trace layer 201 are formed by a same first conductive layer 24, such as a cooper layer, wherein the first conductive layer 24 is formed on the lower laminating layer 202 by plating process, spin-coating process or imprinting process, following by a patterning process so as to pattern the first conductive layer 24 to distinguish out two regions, i.e. the first clamping layer 204 and the first conductive trace layer 201. The first conductive trace layer 201 has a distance from the first clamping layer 204, and the two layers are not electrically connected to each other.

Referring to FIG. 1A again, the second clamping layer 108 is a metallic layer, for example a copper layer, solely formed on the dielectric layer 106 by plating process, spin-coating process or imprinting process. The upper surface 110b of the electronic component 110 contacts the second clamping layer 108, wherein the embedded electronic component structure 100 further includes a second conductive trace layer 103 formed between the dielectric layer 106 and the upper laminating layer 112. The second conductive trace layer 103 may be located between the second clamping layer 108 and the upper laminating layer 112. In other embodiments, the second conductive trace layer 103 may be located between the second clamping layer 108 and the dielectric layer 106 as well.

In other embodiments of the present invention however (for example, that shown by FIG. 2), both the second clamping layer 208 and the second conductive trace layer 203 are formed by a same second conductive layer 28, such as a copper layer, wherein the second conductive layer 28 is formed on the dielectric layer 206 by plating process, spin-coating process or imprinting process, following by a patterning process so as to pattern the second conductive layer 28 to distinguish out two regions, i.e. the second clamping layer 208 and the second conductive trace layer 203. The second conductive trace layer 203 has a distance from the second clamping layer 208, and the two layers are not electrically connected to each other.

Referring to FIG. 1A again, a combination of the first conductive trace layer 101, the second conductive trace layer 103 and the dielectric layer 106 serves as a core substrate layer of the lamination package.

The electronic component 110 includes a plurality of bonding pads 105 disposed on at least one of the upper surface 110b of the electronic component 110 and the lower surface 110a of the electronic component 110. The bonding pads 105 are electrically connected to the first conductive trace layer 101 or the second conductive trace layer 103 through vias.

In some embodiments of the present invention, the first clamping layer 104 and the second clamping layer 108 may also serve as conductive trace layers, ant the bonding pads 105 of the electronic component 110 would electrically connect at least one of the first clamping layer 104 and the second clamping layer 108; but in the present embodiment, the bonding pads 105 do not electrically connect the first clamping layer 104 and the second clamping layer 108.

The upper laminating layer 112 is an insulation enclosing layer made of a dielectric material and covers the second clamping layer 108 for protecting the embedded electronic component structure 100.

The via interconnections 114a, 114b, 114c and 114d are respectively adjacent to the electronic component 110 and penetrate the dielectric layer 106, and respectively connect the first clamping layer 104 and the second clamping layer 108.

Figure 1B:
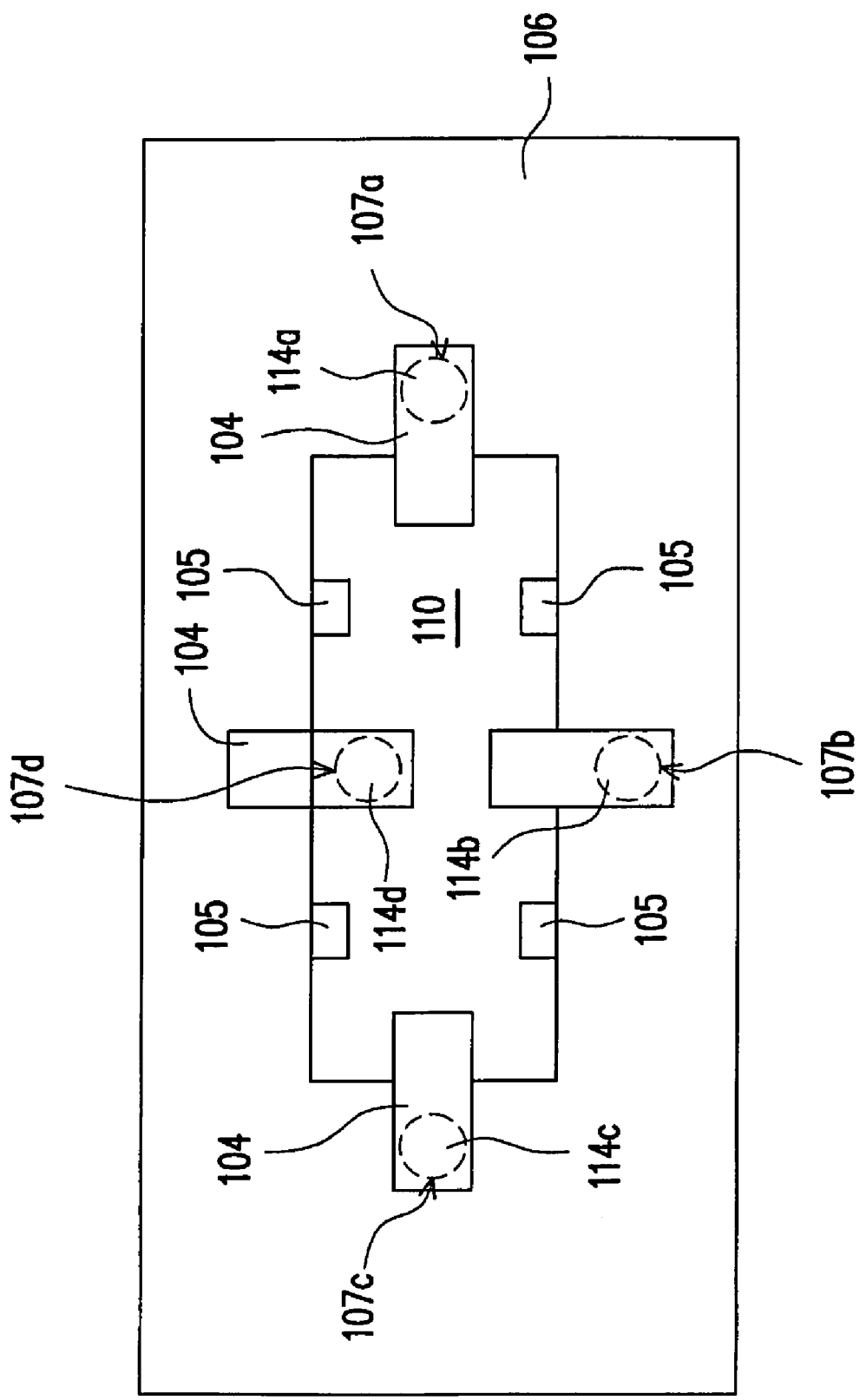
FIG. 1B is a top view diagram based on FIG. 1 showing the position relationships between the electronic component 110, the first clamping layers 104, the bonding pads 105, the blind holes 107a-107d and the via interconnections 114a-114c.

In the embodiment, the via interconnections 114a, 114b, 114c and 114d are respectively fixed in blind holes 107a, 107b, 107c and 107d penetrating the dielectric layer 106 (as shown by FIG. 1B) so as to connect the first clamping layer 104 and the second clamping layer 108. The via interconnections 114a, 114b, 114c and 114d are formed by filling the blind holes 107a, 107b, 107c and 107d with metallic material or non-metallic material, wherein the blind holes 107a, 107b, 107c and 107d have a distance from the electronic component 110. The first clamping layer 104 and the second clamping layer 108 respectively connect all the via interconnections 114a, 114b, 114c and 114d to form U-shape structures for clamping the dielectric layer 106 and the electronic component 110 to enhance the combining strength therebetween.

Figure 3:
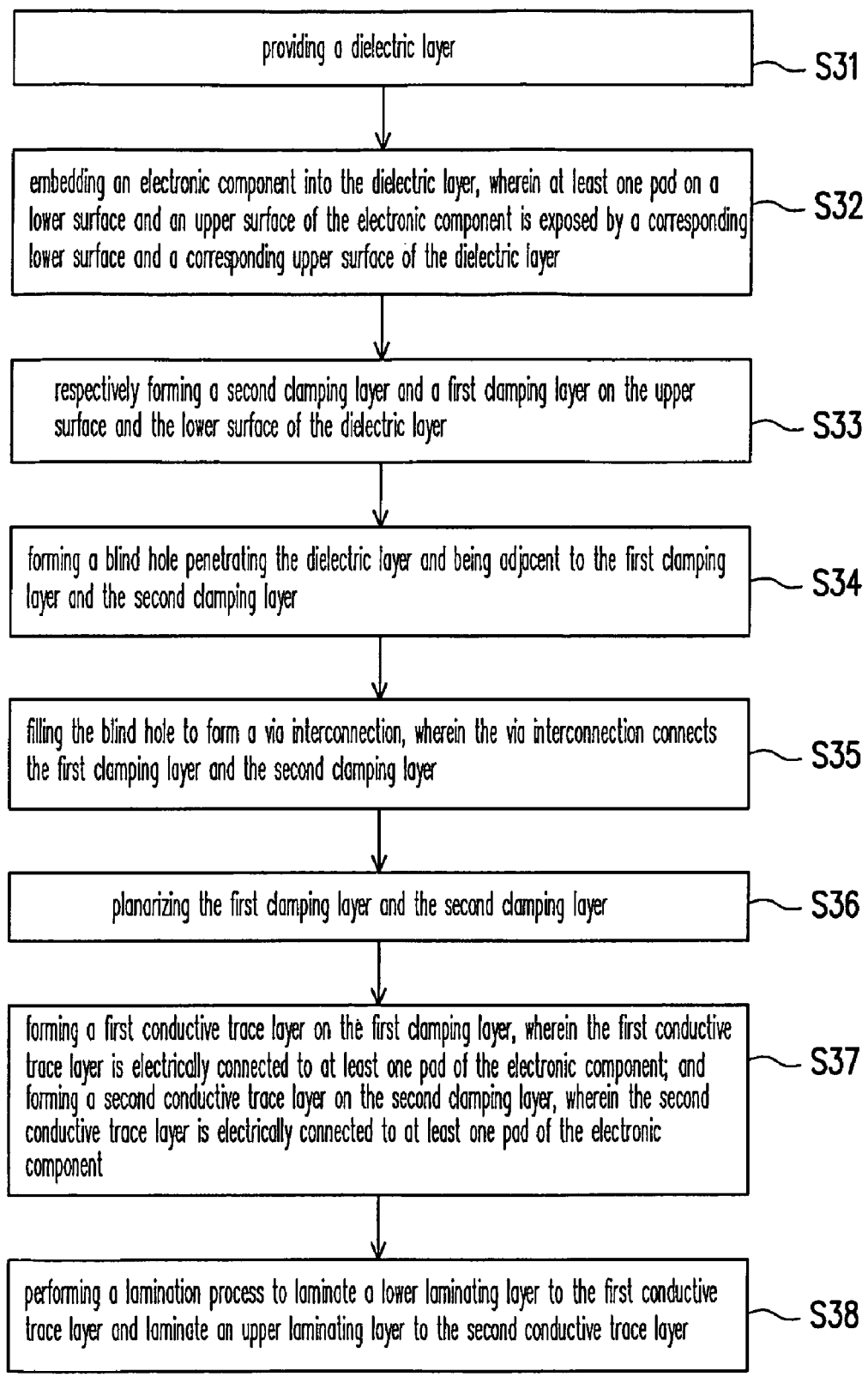
FIG. 3 is a process flowchart for the embedded electronic component structure 100 of FIG. 1.

FIG. 3 is a process flowchart for the embedded electronic component structure 100 of FIG. 1A.

Referring to step S31, a dielectric layer 106 is provided, wherein the dielectric layer 106 has an upper surface 106b and a lower surface 106a. Then, referring to step S32, an electronic component 110 is embedded into the dielectric layer 106 and at least one pad 105 on the lower surface 110a and the upper surface 110b of the electronic component 110 is exposed by the corresponding lower surface 106b and the corresponding upper surface 106a of the dielectric layer 106.

Next, referring to step S33, a second clamping layer 108 is formed on the upper surface 106b of the dielectric layer 106, and a first clamping layer 104 is formed on the lower surface 106a of the dielectric layer 106. In the present embodiment, the first clamping layer 104 and the second clamping layer 108 are formed by the following steps. First, a lamination process is performed to laminate a first conductive layer to the lower surface 106a of the dielectric layer 106 and laminate a second conductive layer to the upper surface 106b of the dielectric layer 106. Then, the laminated first conductive layer and second conductive layer are patterned to form the first clamping layer 104 on the lower surface 106a of the dielectric layer 106 and a second clamping layer 108 on the upper surface 106b of the dielectric layer 106. The material of the first conductive layer and the second conductive layer are copper.

After that, referring to step S34, blind holes 107a, 107b, 107c and 107d penetrating the dielectric layer 106 and being adjacent to the first clamping layer 104 and the second clamping layer 108 are formed. The blind holes 107a, 107b, 107c and 107d are filled to form via interconnections 114a, 114b, 114c and 114d, wherein the via interconnections 114a, 114b, 114c and 114d are respectively connected to the first clamping layer 104 and the second clamping layer 108 as shown in step S35.

After forming the via interconnections 114a, 114b, 114c and 114d, step S36 is conducted to planarize the first clamping layer 104 and the second clamping layer 108. In the present embodiment, the first clamping layer 104 and the second clamping layer 108 are planarized by covering a dielectric material 115 thereon.

Then, referring to step S37, a conventional process is conducted to form a first conductive trace layer 101 on the dielectric material 115 and being connected to at least one pad 105 on the lower surface 110a of the electronic component 110, and form a second conductive trace layer 103 on the dielectric material 115 and being connected to at least one pad 105 on the upper surface 110b of the electronic component 110.

Thereafter, referring to step S38, a lamination process is performed to form an upper laminating layer 112 and a lower laminating layer 102, which are composed of a dielectric material, on the second conductive trace layer 103 and the first conductive trace layer 101 respectively to complete the fabrication of the embedded electronic component structure 100 as shown in FIG. 1A.

Figure 2:
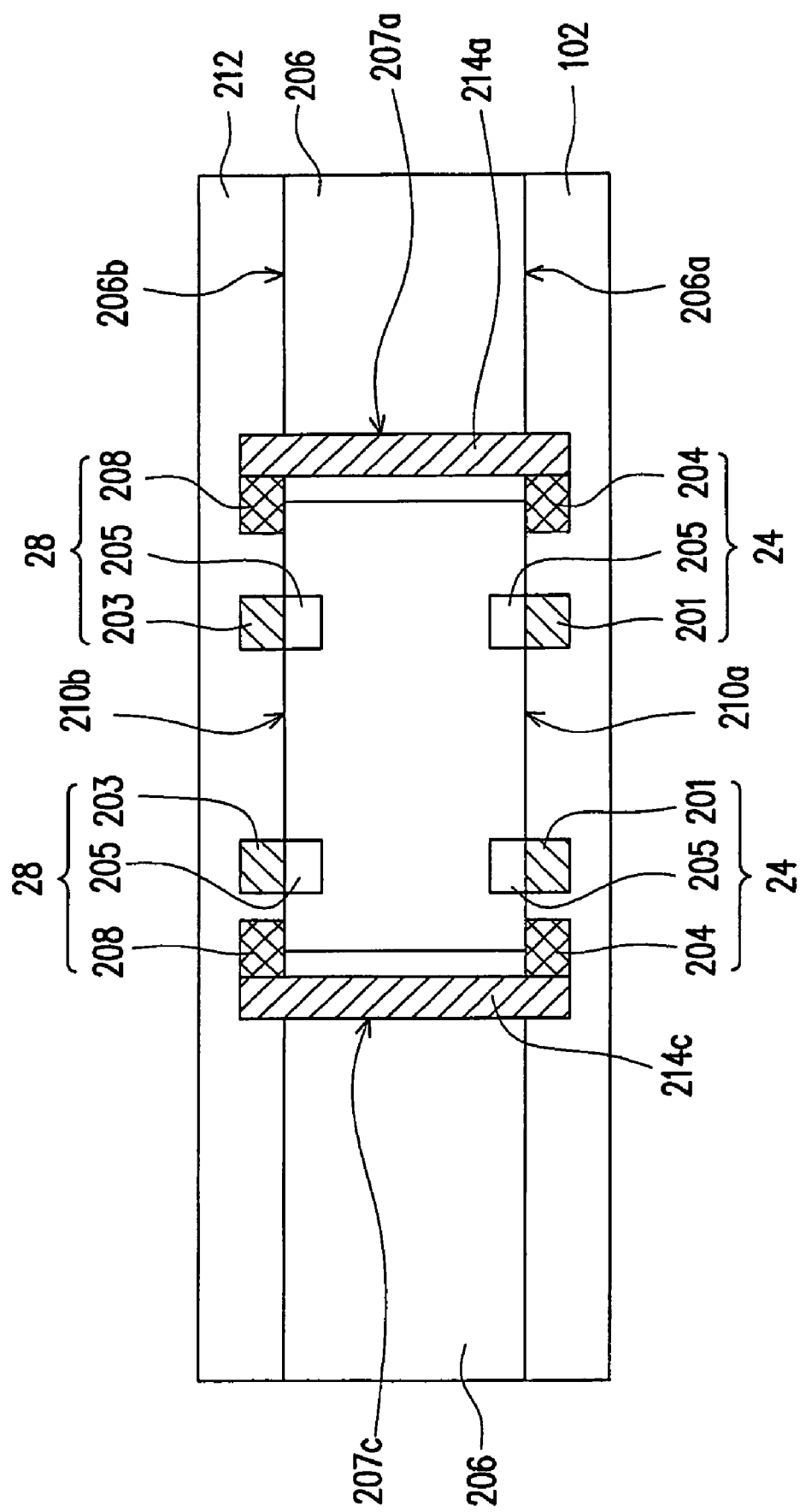
FIG. 2 is a sectional diagram of an embedded electronic component structure 200 according to another embodiment of the present invention.
Figure 4:
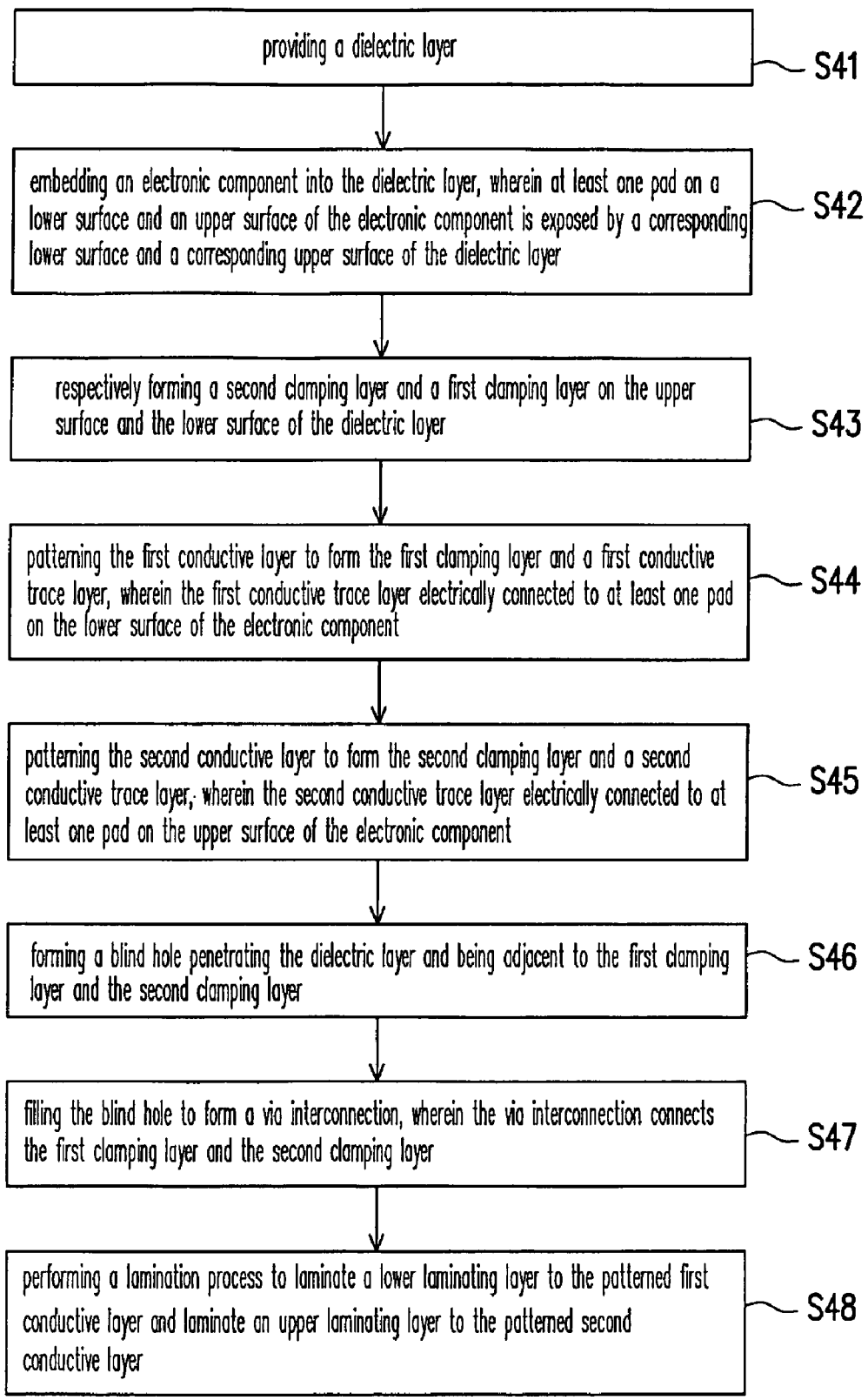
FIG. 4 is a process flowchart for the embedded electronic component structure 200 of FIG. 2.

FIG. 4 is a process flowchart for the embedded electronic component structure 200 of FIG. 2.

Referring to step S41, a dielectric layer 206 is provided, wherein the dielectric layer 206 has an upper surface 206b and a lower surface 206a. Then, referring to step S42, an electronic component 210 is embedded into the dielectric layer 206 and at least one pad 205 on the lower surface 210a and the upper surface 210b of the electronic component 210 is exposed by the corresponding lower surface 206b and the corresponding upper surface 206a of the dielectric layer 206.

Next, a second clamping layer 208 is formed on the upper surface 206b of the dielectric layer 206, and a first clamping layer 204 is formed on the lower surface 206a of the dielectric layer 206.

In the present embodiment, the first clamping layer 204 and the second clamping layer 208 are formed by the following steps. First, referring to step S43, a lamination process is performed to form a first conductive layer 24, such as a copper layer, to the lower surface 206a of the dielectric layer 206 and form a second conductive layer 28, such as a copper layer, to the upper surface 206b of the dielectric layer 206.

Then, referring to step S44, the first conductive layer 24 is patterned to form a first clamping layer 204 and a first conductive trace layer 201, wherein the first conductive trace layer 201 is electrically connected to at least one pad 205 on the lower surface 210a of the electronic component 210. In the present embodiment, the steps of patterning the first conductive layer 24 comprises dividing the first conductive layer 24 into the first clamping layer 204 and the first conductive trace layer 201 isolated from each other.

Next, referring to step S45, the second conductive layer 28 is patterned to form a second clamping layer 208 and a second conductive trace layer 203, wherein the second conductive trace layer 203 is electrically connected to at least one pad 205 on the upper surface 210b of the electronic component 210. In the present embodiment, the steps of patterning the first conductive layer 28 comprises dividing the second conductive layer 28 into the second clamping layer 208 and the second conductive trace layer 203 isolated from each other.

Then, referring to step S46, blind holes 207a and 207c penetrating the dielectric layer 206 and being adjacent to the first clamping layer 204 and the second clamping layer 208 are formed. The blind holes 207a and 207c are filled to form via interconnections 214a and 214c, wherein the via interconnections 214a and 214c are respectively connected to the first clamping layer 204 and the second clamping layer 208 as shown in step S47.

Thereafter, referring to step S48, a lamination process is performed to form a lower laminating layer 202 and an upper laminating layer 212 under the patterned first conductive layer 24 and above the patterned second conductive layer 28, respectively, to complete the fabrication of the embedded electronic component structure 200 as shown in FIG. 2.

According to the embodiments of the present invention, a first clamping layer and a second clamping layer are adopted to respectively contact both the upper surface and the lower surface of the electronic component embedded in the dielectric layer. Then, the via interconnections are formed by filling the blind holes adjacent to the electronic component and penetrating the dielectric layer so as to connect the first clamping layer and the second clamping layer. In this way, the combining strength between the component and the package structure is enhanced by means of a U-shape structure formed by the via interconnections, the first clamping layer and the second clamping layer, and accordingly the problems of a conventional embedded electronic component that insufficient combining strength between the electronic component and the package structure and the delaminate or fracture caused by the insufficient combining strength can be solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An embedded electronic component structure, comprising:
    a lower laminating layer;
    a first clamping layer, disposed on the lower laminating layer;
    a dielectric layer, disposed over the first clamping layer;
    a second clamping layer, located over the dielectric layer;
    an electronic component, having an upper surface and a lower surface and embedded in the dielectric layer, wherein the first clamping layer contacts the lower surface and the second clamping layer contacts the upper surface;
    an upper laminating layer, disposed on and covering the second clamping layer; and a via interconnection, adjacent to the electronic component and penetrating the dielectric layer, and respectively connecting the first clamping layer and the second clamping layer.

2. The embedded electronic component structure according to claim 1, further comprising:
a first conductive layer, located between the dielectric layer and the lower laminating layer and formed by the first clamping layer and a first conductive trace layer, wherein the first conductive trace layer has a distance from the first clamping layer; and
a second conductive layer, located between the dielectric layer and the upper laminating layer and formed by the second clamping layer and a second conductive trace layer, wherein the second conductive trace layer has a distance from the first clamping layer.

3. The embedded electronic component structure according to claim 1, wherein the first clamping layer, the second clamping layer and the via interconnection form a U-shape structure.

4. The embedded electronic component structure according to claim 1, wherein the via interconnection is fixed in a blind hole so as to connect the first clamping layer and the second clamping layer.

5. The embedded electronic component structure according to claim 1, wherein the via interconnection is made of a metallic material or a non-metallic material.

6. The embedded electronic component structure according to claim 1, wherein the electronic component comprises a plurality of bonding pads disposed on at least one of the upper surface and the lower surface.

7. The embedded electronic component structure according to claim 2, wherein the first conductive layer and the second conductive layer are respectively a copper layer.

8. The embedded electronic component structure according to claim 4, wherein the blind hole has a distance from the electronic component.

9. The embedded electronic component structure according to claim 6, wherein at least one of the first clamping layer and the second clamping layer is electrically connected to the bonding pads.

10. The embedded electronic component structure according to claim 6, wherein the bonding pads respectively have a distance from the first clamping layer and a distance from the second clamping layer.

11. A fabrication method of an embedded electronic component structure, comprising:
providing a dielectric layer, wherein the dielectric layer has an upper surface and a lower surface;
embedding an electronic component into the dielectric layer;
respectively forming a first clamping layer and a second clamping layer on the lower surface and the upper surface of the dielectric layer;
forming a blind hole penetrating the dielectric layer and being adjacent to the first clamping layer and the second clamping layer; and
filling the blind hole to form a via interconnection, wherein the via interconnection connects the first clamping layer and the second clamping layer.

12. The fabrication method according to claim 11, wherein the first clamping layer and the second clamping layer are formed by:
performing a lamination process to laminate a first conductive layer to the upper surface and laminate a second conductive layer to the lower surface; and
patterning the first conductive layer and the second conductive layer.

13. The fabrication method according to claim 11, after forming the via interconnection, further comprising:
filling a dielectric material to planarize the first clamping layer and the second clamping layer;
forming a first conductive trace layer on the first clamping layer, wherein the first conductive trace layer is electrically connected to at least one pad of the electronic component;
forming a second conductive trace layer on the second clamping layer, wherein the second conductive trace layer is electrically connected to at least one pad of the electronic component; and
performing a lamination process to laminate a lower laminating layer to the first conductive trace layer and laminate an upper laminating layer to the second conductive trace layer.

14. The fabrication method according to claim 11, wherein the step of filling the blind hole to form the via interconnection comprises performing an electroplating process to deposit a conductive material in the blind hole, the conductive material connecting the first clamping layer and the second clamping layer.

15. The fabrication method according to claim 11, wherein the step of filling the blind hole to form the via interconnection comprises filling the blind hole with an adhesive material to connect the first clamping layer and the second clamping layer.

16. The fabrication method according to claim 12, wherein patterning the first conductive layer comprises forming the first clamping layer and a first conductive trace layer; and
patterning the second conductive layer comprises forming the second clamping layer and a second conductive trace layer.

17. The fabrication method according to claim 16, wherein the first conductive trace layer is isolated from the first clamping layer.

18. The fabrication method according to claim 16, after filling the blind hole, further comprising performing a lamination process to form a lower laminating layer on the patterned first conductive layer and form an upper laminating layer on the patterned second conductive layer.

19. The fabrication method according to claim 17, wherein the second conductive trace layer is isolated from the second clamping layer.

20. The fabrication method according to claim 19, wherein the first conductive trace layer and the second conductive trace layer are electrically connected to at least one pad of the electronic component, respectively.

* * * * *